United States Patent
Arnold et al.

(10) Patent No.: US 8,985,020 B2
(45) Date of Patent: Mar. 24, 2015

(54) METHOD AND APPARATUS FOR THERMAL TREATMENT OF PRINTING SURFACE IN RELIEF PRINTING

(71) Applicant: E I du Pont de Nemours and Company, Wilmington, DE (US)

(72) Inventors: Carl Bernard Arnold, Newark, DE (US); Gary W. Foggin, Wilmington, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 13/666,096

(22) Filed: Nov. 1, 2012

(65) Prior Publication Data

US 2013/0108968 A1 May 2, 2013

Related U.S. Application Data

(60) Provisional application No. 61/554,635, filed on Nov. 2, 2011.

(51) Int. Cl.
*G03F 7/36* (2006.01)
*B41C 1/00* (2006.01)
*G03F 7/34* (2006.01)

(52) U.S. Cl.
CPC ... *G03F 7/36* (2013.01); *B41C 1/00* (2013.01); *G03F 7/34* (2013.01)
USPC ............ 101/401.1; 430/306; 430/270.1; 430/355

(58) Field of Classification Search
None
See application file for complete search history.

(56) References Cited

U.S. PATENT DOCUMENTS

| | | | |
|---|---|---|---|
| 3,060,023 A | 10/1962 | Burg et al. | |
| 3,060,024 A | 10/1962 | Burg et al. | |
| 3,060,026 A | 10/1962 | Heiart | |
| 3,922,751 A | 12/1975 | Wessells et al. | |
| 4,042,996 A | 8/1977 | Wessells et al. | |
| 4,197,126 A | 4/1980 | Wessells et al. | |
| 4,323,636 A | 4/1982 | Chen | |
| 4,323,637 A | 4/1982 | Chen et al. | |
| 4,427,759 A | 1/1984 | Gruetzmacher et al. | |
| 4,726,877 A | 2/1988 | Fryd et al. | |
| 4,753,865 A | 6/1988 | Fryd et al. | |
| 5,015,556 A | 5/1991 | Martens | |
| 5,175,072 A | 12/1992 | Martens | |
| 5,262,275 A | 11/1993 | Fan | |
| 5,279,697 A | 1/1994 | Peterson et al. | |
| 5,506,086 A | 4/1996 | Van Zoeren | |
| 5,607,814 A | 3/1997 | Fan et al. | |

(Continued)

FOREIGN PATENT DOCUMENTS

EP 0741330 A1 11/1996
EP 1400857 A1 3/2004

(Continued)

OTHER PUBLICATIONS

U.S. Appl. No. 13/666,148, filed Nov. 1, 2012, Arnold et al.

(Continued)

*Primary Examiner* — Joshua D Zimmerman

(57) ABSTRACT

A heating step is performed in a printing operation where a gas jet emitting from a nozzle assembly impinges the exterior surface of a printing plate. The gas impingement provides rapid and specific convective heat flux to the exterior surface of the printing plate.

34 Claims, 6 Drawing Sheets

(56) References Cited

U.S. PATENT DOCUMENTS

| | | |
|---|---|---|
| 5,719,009 A | 2/1998 | Fan |
| 5,766,819 A | 6/1998 | Blanchet-Fincher |
| 5,840,463 A | 11/1998 | Blanchet-Fincher |
| 6,797,454 B1 | 9/2004 | Hackler et al. |
| 6,844,142 B2 | 1/2005 | Schadebrodt et al. |
| 2006/0292495 A1* | 12/2006 | Roshelli et al. ............... 430/302 |
| 2008/0248428 A1 | 10/2008 | Teltschik et al. |

FOREIGN PATENT DOCUMENTS

| | | |
|---|---|---|
| EP | 1685447 B1 | 1/2012 |
| JP | 53-(1978)-8655 | 1/1978 |
| JP | 58-1983-52646 | 3/1983 |
| JP | 2001-179928 A | 7/2001 |
| JP | 2001/179928 A | 7/2001 |
| JP | 2003-131376 A | 5/2003 |
| JP | 2003-295471 A | 10/2003 |
| WO | 01/90818 A1 | 11/2001 |
| WO | 01/18604 A2 | 12/2001 |
| WO | 2005/050327 A1 | 6/2005 |
| WO | 2010/014293 A1 | 2/2010 |

OTHER PUBLICATIONS

IM1365 PCT Search Report.
IM1372 PCT Search Report.

* cited by examiner

METHOD AND APPARATUS FOR THERMAL TREATMENT OF PRINTING SURFACE IN RELIEF PRINTING

CROSS-REFERENCE TO RELATED APPLICATION

This application claims priority under 35 U.S.C. §119 from U.S. Provisional Application Ser. No. 61/554,635 (filed Nov. 2, 2011), the disclosure of which is incorporated by reference herein for all purposes as if fully set forth.

BACKGROUND OF THE INVENTION

1. Field of the Disclosure

The present invention pertains to devices and methods for thermal treatment of photosensitive elements for use as printing forms, in which the thermal treatment involves gas fluid treatment.

2. Description of Related Art

In a process for preparing from a photosensitive element a relief printing form, the printing form is often mounted around the circumference of a rotatable drum and heated to soften unpolymerized portions of the element for removal and create a relief surface of the printing form. During thermal processing, the drum is rotated and the heated printing form is placed in contact with a development medium, such as an absorbent surface, to remove the unpolymerized portions. It is desirable for thermal processing systems to heat the element to sufficient temperatures to soften or liquefy the unpolymerized portions of the element without undue heating of the element and underlying materials.

It is also desirable to keep the printing form firmly against the drum surface, particularly if the drum surface is cooled, to prevent or minimize heating a back side of the printing form and to keep a support on the backside below its glass transition temperature or its annealing temperature. If the support of the printing form is heated to or above its glass transition temperature during thermal processing, the support can distort and result in deformations in the final processed relief printing form.

One method to supply heat to the element is through conduction from an internally heated metal pressure roller covered with a solid silicone elastomer. This method involves high temperatures at the interface of the pressure roller surface and silicone elastomer, owing to the low thermal conductivity of the silicone elastomer. Temperatures at the interface were at, or sometimes in excess of, operating limits for the silicone elastomer and/or any underlying adhesive, resulting in delamination of the silicone elastomer from the pressure roller. The resulting expense and reduced operational yields were addressed through the use of supplemental heat sources to allow lower interface temperatures.

The use of infrared (IR) heaters to supplement the heat supplied by the drum and/or pressure roll has been a successful combination, but operational costs and heat specificity can be improved. Although effective, the IR heating is not optimum for a transparent photopolymer material as the absorption of IR energy occurs throughout the photopolymer material in addition to any base layers, for example a polyester base support. Application of heat to the surface of the photopolymer material would result in several process advantages, including lowered, or in some cases, no heat supplied from the pressure roller.

Thermal processing of photopolymer plates should be near 250° F. for existing materials to achieve beneficial removal rates of unpolymerized portions. The temperature of the interface of the photopolymer material and the polyester base material should be less than the glass transition temperature ($T_g$) of the polyester base material and considerably less than temperature threshold of degradation of image registration, about 150° F. As an example of the thermal gradients required in relief printing, photopolymer layer thickness can be 0.014 inches, with 230° F. at the top surface of the photopolymer layer and 130° F. at the bottom of the photopolymer layer to avoid approaching the $T_g$ of the support, resulting in a temperature gradient of 7,000° F./inch (1500° C./cm). To achieve such a gradient requires rapid heating of the surface of the photopolymer layer. As can be readily appreciated, the use of only conduction heating from a pressure roll through thermally-insulating absorbent surface of the development medium is simply outside the bounds of such a requirement.

One example of a printing form is a relief printing plate, and in particular a flexographic printing plate. The invention disclosed herein can be used with flexographic plates, as well as other printing forms. Flexographic printing plates are well known for use in printing on soft and relatively hard materials, such as packaging materials, e.g. cardboard, plastic films, aluminum foils, etc. Flexographic printing plates can be prepared from photosensitive printing forms containing photopolymerizable compositions, such as those described in U.S. Pat. Nos. 4,323,637 and 4,427,759. DuPont has sold flexographic plates under the tradename CYREL® and has sold equipment for manufacturing the flexographic plates under the tradename CYREL® FAST.

For example, processors for thermal development of flexographic printing forms may have rotatable drums about which flexographic plates must be secured. One such processor is described in U.S. Pat. No. 5,279,697. As disclosed in U.S. Pat. No. 5,279,697, an automated process and apparatus can be used for handling an irradiated printing form and heating and pressing the print form to remove the unirradiated composition from the printing form. As disclosed in U.S. Pat. No. 5,279,697, the printing form is secured to a preheating drum with a clamp flush mounted transversely on an outer surface of the drum.

Similarly, in a commercial thermal processor sold under the tradename CYREL® FAST 1000TD, an exterior surface of the drum includes a silicone rubber layer having a Shore A hardness of 50, and a tackification layer on the rubber layer. The tackification layer is DOW 236, a silicone dispersion in solvent, available from Dow Corning, and it adheres the printing form to the drum.

Processors for thermal development of flexographic printing elements are known. U.S. Pat. No. 5,279,697 and U.S. Pat. No. 6,797,454 each describe an automated process and apparatus for handling an irradiated printing element and accomplishing repeated heating and pressing to remove the unirradiated composition from the element with a web of absorbent material. Both apparatuses include a hot roller for supporting the web of absorbent material in contact with the photosensitive element to heat the element and remove the molten polymer with the absorbent material during thermal development. In U.S. Pat. No. 5,279,697 the element having irradiated and unirradiated areas is mounted on a preheating drum that is heated with an electrically heated blanket mounted on an inner surface of a main wall of the drum. The heat must travel through the wall of the drum and through the flexible substrate to preheat the composition layer to a temperature near the melt point of the unirradiated area. But the heated drum may heat the support of the element to such an extent that the support may distort and/or shrink which can affect the dimensional stability of the relief area of the printing plate. U.S. Pat. No. 6,797,454 avoids such undesirable distortion and/or shrinkage of the support by cooling the support simultaneous to the heating of the composition layer. Cooling of the support is carried out by blowing air on the circumferential surface of the drum while providing additional heat to an exterior surface of the composition layer with infrared heating devices prior to contact of the absorbent material with the hot roller.

U.S. Pat. No. 4,197,126 teaches an air etching process using a gas stream. Materials removed via the gas stream are relatively thin liquids having material viscosities of 100-10, 000 cps between room temperature and 200° F. (93° C.), preferred material viscosity is 200 cps.

It is desirable for thermal processing systems to heat a photopolymerizable element to sufficient temperature to soften or liquefy unpolymerized portions of the element without undue heating of the element. A need arises for a method and apparatus to thermally process the photopolymerizable element that quickly heats and removes uncured portions of the photopolymerizable material from the layer, while preventing or minimizing heating of a back side of the element and to keep a support on the backside below its glass transition temperature or its annealing temperature.

SUMMARY

The present invention is a method for preparing a relief printing form from a photosensitive element having an exterior surface and comprising a layer of a photopolymerizable composition capable of being partially liquefied. This method comprises the steps of: (a) heating the exterior surface to a temperature sufficient to cause a portion of the layer to liquefy and form liquefied material; and (b) contacting the photosensitive element with a development medium to allow the liquefied material to be removed by the development medium. The heating step is performed using a gas jet emitting from a nozzle assembly at a velocity of about 10 to about 35 meter/second and temperature of about 110° C. to about 350° C. This gas jet impinges the exterior surface at a heat flux greater than 10 kilowatts/m² for a dwell time of less than 15 seconds.

In one embodiment, the heat flux is between 10 to 70 kiloWatts/m² and the nozzle assembly contains an aperture forming a slot or alternatively a plurality of openings. The dimensions of the slot or plurality of openings is not limited, and only depends upon the ability to achieve required heat flux and uniformity of gas flow across the slot or plurality of openings. When the aperture is in the form of the slot, heat flux of the jet of heated gas (expressed in kWatt/m²) may be represented by the following equation, EqnA:

heat flux=−32.5 (kW/m²)+[0.687 (kW-sec/m³)*velocity (m/sec)]+[0.203 (kW/m²° C.)*temperature (° C.)]  (EqnA)

wherein the velocity is 15 to 30 meter/second and the temperature is 120° C. to 330° C., of the jet of heated gas. When the aperture is in the form having the plurality of openings, heat flux of the jet of heated gas (expressed in kWatt/m²) may be represented by the following equation (EqnB):

heat flux=−33.3 (kW/m²)+[1.77 (kW-sec/m³)*velocity (m/sec)]+[0.189 (kW/m²° C.)*temperature (° C.)]  (EqnB)

wherein the velocity is 15 to 30 meter/second and the temperature is 120° C. to 330° C., of the jet of heated gas.

The present invention also includes an apparatus for preparing a relief printing form from a photosensitive element having an exterior surface and comprising a layer of a photopolymerizable composition capable of being partially liquefied. The apparatus comprising means for heating the exterior surface to a temperature sufficient to cause a portion of the layer to liquefy and form liquefied material. The apparatus comprises means for contacting the photosensitive element with a development medium to allow the liquefied material to be removed by the development medium. The means for heating is performed with a gas jet emitting from a nozzle assembly at a velocity of 10 to 35 meter/second and temperature of 110 to 350° C., and impinges the exterior surface at a heat flux greater than 10 kWatts/m² for a dwell time of less than 15 seconds.

In another embodiment the means for contacting comprises a roller assembly for supporting the development medium, the roller assembly includes a roller that is heated to a temperature of 150° C. to 250° C. The jet of heated gas from the nozzle assembly preheats the element, the roller assembly is located adjacent the nozzle assembly at a distance from the exit of the nozzle of 0.5 inch (1.27 cm) to 3 inch (7.62 cm).

BRIEF DESCRIPTION OF THE DRAWINGS

The invention can be more fully understood from the following detailed description thereof in connection with the accompanying drawings described as follows.

DETAILED DESCRIPTION OF ILLUSTRATIVE EMBODIMENTS

Figure 1:
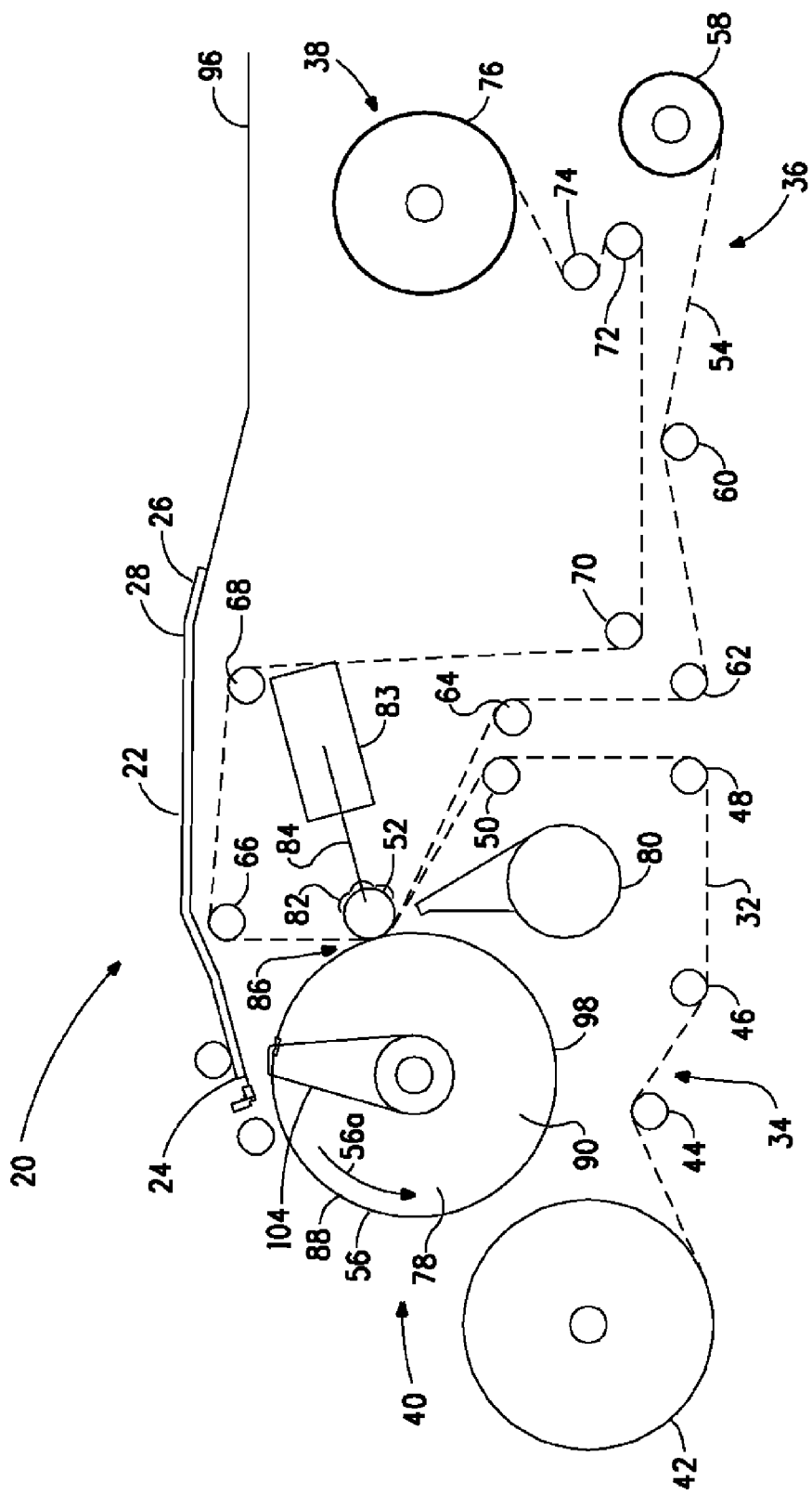
FIG. 1 is an overall schematic of one embodiment of a thermal development apparatus and process for forming a relief printing form.

Throughout the following detailed description, similar reference characters refer to similar elements in all figures of the drawings.

This invention relates to new and improved systems and methods for thermal treatment or development of a photosensitive element, or a printing form precursor, using high temperature fluid impingement on an exterior surface of the element to heat the precursor sufficient to soften, melt, or liquefy, an unexposed portion of a layer of the photosensitive composition. One example of the fluid is air. A blower is used to accelerate the air through a nozzle assembly in a controlled flow upon printing form precursor. The present invention can generally be used in thermal development processors that are used to prepare printing forms from the photosensitive elements. Application of a high temperature fluid impinging on a surface of the photosensitive element achieves the desired gradient across the photosensitive layer since the impinging high temperature fluid rapidly heats the surface with no or only minimal heating of a support side of the element. Placement of a device, such as a nozzle assembly that is capable of delivering high temperature fluid impingement prior to the pressure roll provides rapid heating of the photopolymerizable layer just prior to contact by a development medium that is supported by a pressure roll. The rapid heating with impinging high temperature fluid also avoids heating the support of the photosensitive element at or above its glass transition temperature and its annealing temperature.

Thermal development or treatment of the element includes heating the photopolymerizable element having at least one photopolymerizable layer (and the additional layer/s) to a temperature sufficient to cause the uncured portions of the photopolymerizable layer to liquefy, i.e., soften or melt or flow, and removing the uncured portions. The layer of the photosensitive composition is capable of partially liquefying upon heating by thermal development. That is, during thermal development the uncured composition must soften or melt or flow at a reasonable processing or developing temperature. The polymerized areas (cured portions) of the photopolymerizable layer have a higher melting temperature than the unpolymerized areas (uncured portions) and therefore do not melt, soften, or flow at the thermal development temperatures. The uncured portions can be removed from the cured portions of the composition layer by contacting with a development medium.

The terms "melt", "liquefy" and "flow" are used to describe the behavior of the unirradiated portions of the solid composition layer subjected to an elevated temperature that softens and reduces the viscosity to permit removal by the development medium. In particular in the present context of thermal development, "liquefy" or "liquefying" or "liquefied" are often used to described uncured portions of the photopolymerizable layer that are heated sufficiently for removal by contact with a development medium, but it should be understood that the heated uncured portions are extremely viscous, and are not liquid in the conventional sense. The material of the meltable portion (or liquefied portion, or flow portion) of the composition layer is usually a viscoelastic material which does not have a sharp transition between a solid and a liquid, so the process functions to remove or absorb the heated composition layer at any temperature above some threshold for removal by the development medium. A wide temperature range may be utilized to liquefy, i.e., "soften" or "melt" or "flow", the composition layer for the purposes of this invention. During thermal treatment the uncured composition must soften or melt or flow at a reasonable processing or developing temperature but not be subject to cold flow, i.e., dimensional change, during normal storage. Often removal by the development medium is by absorption of the highly viscous uncured material into an absorbent medium. Absorption may be slower at lower temperatures and faster at higher temperatures during successful operation of the process.

FIG. 1 shows one embodiment of a thermal development system 20 for preparing a relief printing form from a photosensitive element having an exterior surface and containing a layer of a photopolymerizable composition capable of being partially liquefied. A gas jet exiting a nozzle assembly 80 heats the photopolymerizable composition to form liquefied material which is subsequently removed with a development medium that includes an absorbent web 32, which is typically a non-woven, and a foil 54. After imagewise exposure, the uncured portion (i.e., unexposed portion) of the printing form must be removed to form a relief surface suitable for printing. The relief surface contains raised portions and recessed portions. Thermal processing avoids the use of solvents and the associated time to dry the printing form. Thermal processing as shown in FIG. 1 is therefore the preferred method.

The nozzle assembly 80 is shown in FIG. 1 to supply heat to a photosensitive or a printing form precursor 22. Nozzle assembly 80 uses a heated gas to heat a surface 28 of the printing form precursor 22 to soften or liquefy undeveloped portions of the surface 28. A nonreactive gas, in one embodiment the gas is air, is forced through the exit (described below) of the nozzle assembly 80 at controlled velocity, temperature and flow conditions resulting in a rapid and efficient heat transfer to the surface 28 of the printing form precursor 22. This selective heating of the surface 28 results in better process control and energy efficiency than prior art processes relying on heating of a drum 56 and/or a pressure roller 52 to achieve required temperature of the precursor 22.

In one embodiment the heated gas is air, and the jet of heated air has a heat flux that is equal to or greater than 10 kiloWatts/m$^2$ (kW/m$^2$) that is imparted to the surface 28 when under the influence of the jet of heated air for less than 15 seconds, this time period is also referred to as dwell time. The dwell time is defined as the time the surface 28 is influenced by the jet of heated gas prior to contact of the printing form precursor 22 with the development medium by the pressure roller 52. In some embodiments the heat flux is a peak heat flux or maximum heat flux experienced at the surface 28 of the precursor 22. In most embodiments the peak heat flux is the heat flux experienced by the precursor 22 at an impingement point in which the jet of heated gas impinges the surface 28. In some embodiments the dwell time is the period in which the surface 28 of experiences the jet of heated gas impinging at the peak heat flux. In some other embodiments the dwell time is the period in which the surface 28 experiences the jet of heated gas impinging (at the impingement point) and redirected portions of the jet of heated gas stream (after impingement). The means for heating the gas is not limited, and in one embodiment is an electrical resistance heater, and in another embodiment a combustion heat exchanger is used.

The heat flux is the heat energy transfer rate by impingement of the gas (jet) exiting the nozzle through a unit surface area of the exterior surface of the photosensitive printing form precursor. Heat flux can be measured with a thin-film heat flux sensor, which functions as a self-generating thermopile transducer, that can be mounted onto a surface. In one embodiment for determining heat flux of the jet of heated air, one or more heat flux sensors are mounted directly onto the exterior surface of the drum. Two or more heat flux sensors can be aligned in array along the axial length of the drum, in some cases at fixed spacing, to measure the heat flux uniformity of the jet of heated air exiting the nozzle assembly and impinging the drum surface. In another embodiment for determining heat flux of the jet of heated air, the one or more heat flux sensors are mounted onto a piece of insulating material that fits into a slot or recessed area on the drum 56 so that the sensor is positioned flush with the exterior surface of the drum. An assembly for coupling or mounting the precursor on the drum can be removed from the slot or recessed area on the drum so that the heat flux sensor can be mounted in the slot, or a slot dedicated for the heat flux sensor can be formed on the drum. Placing the heat flux sensors on the insulating material allows for easy removal and mounting of more than one heat flux sensors, and isolates the sensor/s from influence of the drum temperature, which provides improved reproducibility since a substrate under the sensor will influence the measurement somewhat. In most embodiments, a heat flux sensor is used for the design, testing, and scale-up phases of a thermal development system to establish suitable design and operating conditions for the nozzle assembly that will provide the necessary heat flux, and is not included for the normal operation of the thermal development system processing printing form precursors. In most embodiments, the heat flux of the jet of heated gas that is sufficient to heat the exterior surface and at least soften portions of the photopolymerizable layer is the peak heat flux at a particular dwell time (or surface speed of the precursor) and gap between the gas exit of the nozzle and the exterior surface of the precursor.

A heat flux sensor that is suitable for determining heat flux of the jet of heated air that is created by the nozzle assembly is model HFS-4, which is 6.5 μV/BTU/Ft$^2$Hr sensor with Type K TC (thermocouple) from Omega Engineering (Stamford, Conn., USA). The insulator that is suitable for used with this heat flux sensor is a machinable glass ceramic composite, type 914, that is 6.35 mm thick, and has a thermal conductivity of about 0.40 W/mK from Cotronics Corporation (Brooklyn, N.Y.; USA).

The heat flux of the jet of heated gas of at least 10 kW/m$^2$ provides sufficient heat to the exterior surface of the printing form precursor to at least soften portions of the photopolymerizable layer, and yet avoids heating of the support of the precursor above its glass transition temperature or annealing temperature. In another embodiment the heat flux of the jet of heated gas is in a range of about 10 kW/m$^2$ to about 70 kW/m$^2$. In another embodiment the heat flux is in a range of about 20 kW/m$^2$ to about 65 kW/m$^2$. The high velocity gas strikes the surface 28 to remove a boundary layer (not shown) and impinge upon the surface 28. This process is referred to as gas jet impingement, as the high velocity gas impinges upon the surface 28 at a stagnation point (nor shown) which redirects portions of the gas stream to one or both sides of the stagnation point. Velocity of the gas jet at the exit of the nozzle assembly 80 can vary between 10 meters/sec (m/s) and 35 m/s, in another embodiment 15 m/s to 30 m/s, and in another embodiment 17 m/s to 27 m/s. Temperature of the gas jet at the exit of the nozzle assembly 80 can vary between 110° C. to 350° C., in another embodiment 120° C. to 330° C., and in yet another embodiment 170° C. to 320° C. The dwell time in some embodiments is 0.25 seconds to 15 seconds; in some other embodiments is 0.5 seconds to 12 seconds; in yet other embodiments is 0.5 seconds to 10 seconds; in other embodiments is 2 seconds to 15 seconds. There is an inverse relationship between heat flux and dwell time. Dwell time may be in a range of 2 seconds to 14 seconds with an inverse relationship between heat flux and dwell time, for example a high heat flux can be used with a lower dwell time. In addition, the minimization of distance between the exit of nozzle assembly 80 and the surface 28 improves efficiency of the heat transfer, in one embodiment the gap between the exit of nozzle assembly 80 and the surface 28 is 1 millimeter (mm) to 15 mm, in another embodiment the gap is 2 mm to 9 mm. The gas jet exiting the nozzle assembly 80 impinges the surface 28 at an angle between 45 and 135 degrees relative to a tangent at the impingement point of surface 28. In another embodiment the angle of the jet impinging the surface is between 80 and 100 degrees relative to a tangent at the impingement point of surface 28.

Nozzle Assembly

Figure 2:
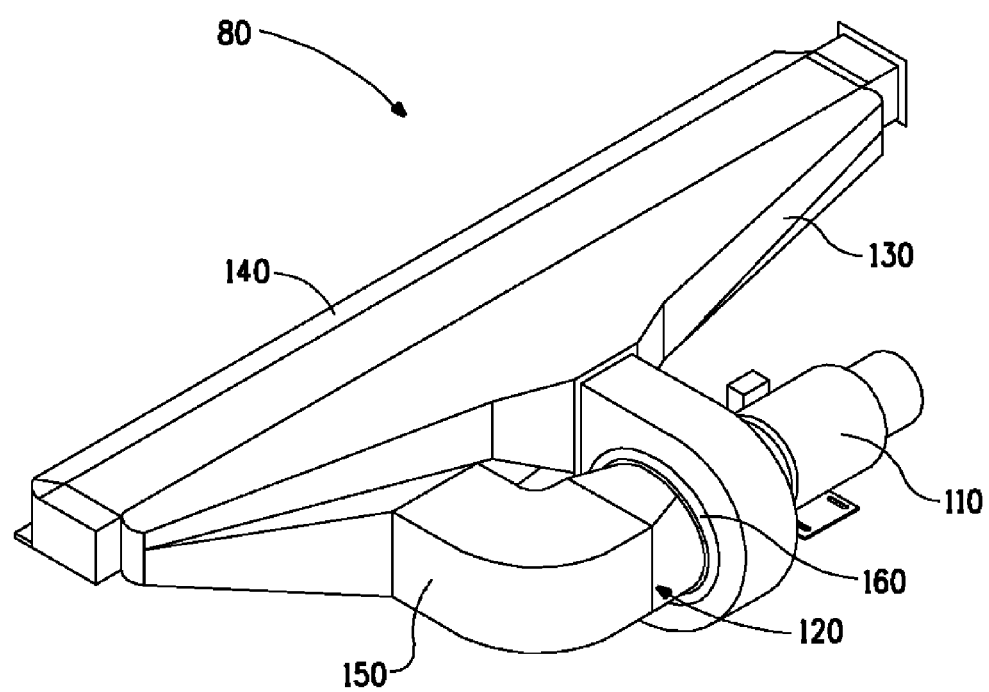
FIG. 2 is a perspective view of one embodiment of a nozzle assembly for the thermal development apparatus.

FIG. 2 illustrates one embodiment of the nozzle assembly 80 having at least one motor 110 to turn blower 160, which create a low pressure that draws in gas to an inlet 120 and then accelerates the gas to feed a plenum 130 that smoothes and distributes the gas to a gas exit 140. Recycle 150 captures a portion of heated gas after impingement on surface 28 (not shown). The gas exit 140 has a length that provides for impingement by heated gas on a portion of a transverse dimension of the precursor 22 as the precursor transports by the nozzle assembly 80. The length of the gas exit 140 is the same or substantially the same as an axial length of the drum 56, and may be the same, substantially the same, or greater than a dimension of the precursor that is transverse to the machine direction (i.e., transport direction) of the drum 56.

Figure 3:
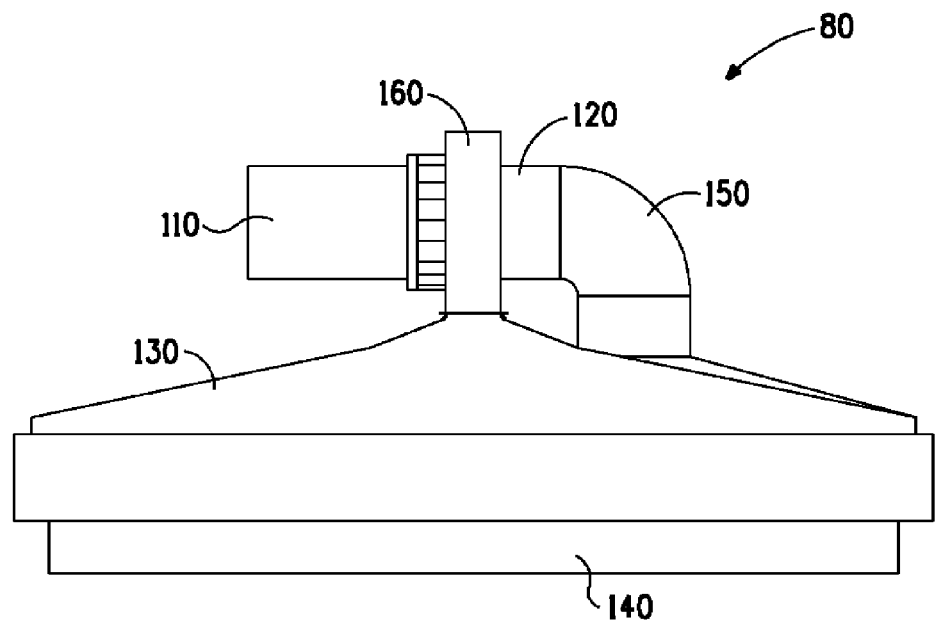
FIG. 3 is a top view of the nozzle assembly shown in FIG. 2.

FIG. 3 illustrates the nozzle assembly 80, in which the recycle 150 gas stream becomes the gas inlet 120, and the gas stream is accelerated by the blower 160 into the plenum 130 for distribution of the gas to the gas exit 140 to heat the exterior surface 28 of the precursor 22.

Figure 4:
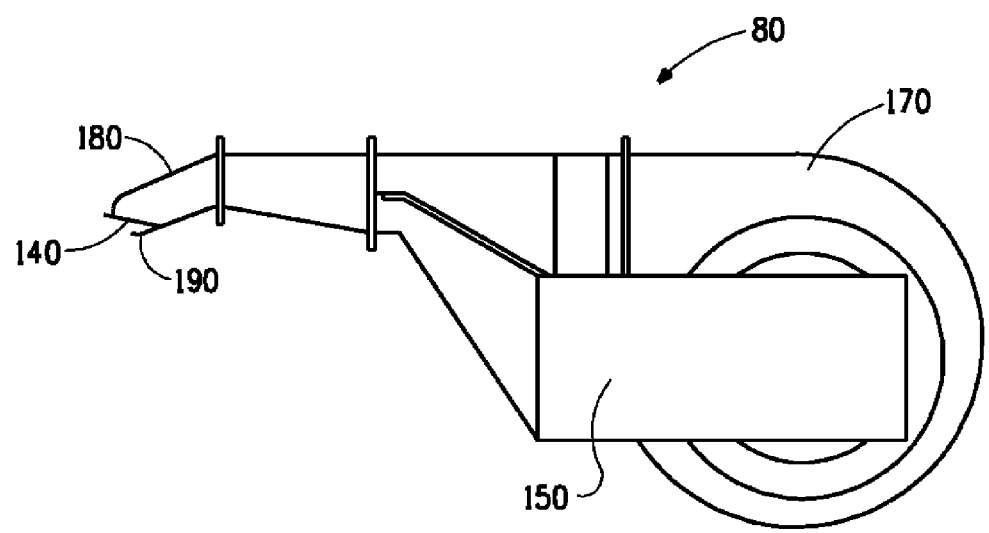
FIG. 4 is a side view of the nozzle assembly shown in FIG. 2.

FIG. 4 shows the nozzle assembly 80 shown in FIG. 2, the recycle 150 allows gas to enter a blower housing 170 and a tip 180 guides gas to the gas exit 140. A seal 190 helps redirect gas that has impinged surface 28 (not shown) into the recycle 150. The seal 190 may contact surface 28 (not shown) or be located in close proximity to surface 28.

Figure 5:
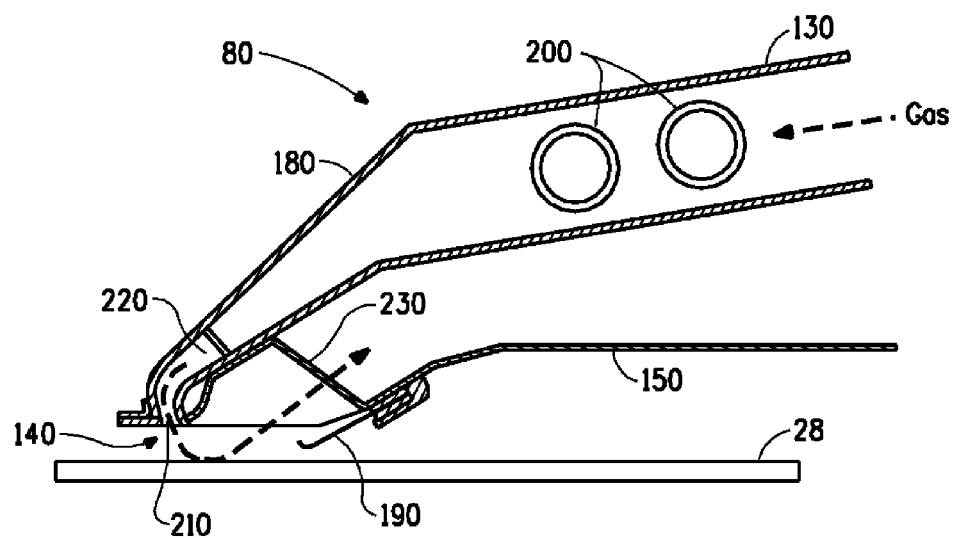
FIG. 5 is an enlarged cross-sectional view of one embodiment of the exit portion of the nozzle assembly shown in FIG. 2.

FIG. 5 is an enlarged side view of the gas exit 140 of the nozzle assembly 80 shown in FIG. 2, where the gas flow is indicated by bold segmented lines having a directional arrow. A heating means 200 heats the gas entering the tip 180 and exiting a slot 210. As mentioned previously, the heating means 200 can be provided by any number of methods. In this embodiment the aperture or slot 210 is in the form of a slit having a width that is substantially smaller than its length (that is the same substantially the same as the axial length of the drum 56). A support 220 is located within the tip 180 to provide structural stability at the slot 210 in addition to minimizing any disturbance to the gas flow. In this embodiment seal 190 helps direct gas flow to the recycle 150 to lower energy costs by capturing gas already heated to process temperatures. A rib 230 provides rigidity to the slot 210 in the embodiment where the slot 210 is open at the gas exit 140. The slot 210 may include a plurality of one or more supports 220, or one or more ribs 230 along its length. The area at the gas exit 140 of slot 210 is also called the aperture. In one embodiment, when the gas exit 140 is in the open form of the slot 210, heat flux of the jet of heated gas (expressed in kW/m$^2$) may be represented by the following equation (EqnA):

$$\text{heat flux} = -32.5 \ (kW/m^2) + [0.687 \ (kW\text{-}sec/m^3)^* \text{velocity} \ (m/sec)] + [0.203 \ (kW/m^2 \cdot °C.)^* \text{temperature} \ (°C.)] \quad \text{(EqnA)}$$

wherein the velocity is 15 to 30 meter/second and the temperature is 120° C. to 330° C., of the jet of heated gas. This same equation for determining the heat flux (expressed in kW/m$^2$) of the jet of heated gas for a nozzle assembly having the slot of an open slit can be more simply expressed (by removal of units) as $$\text{heat flux} = -32.5 + [0.687^* \text{velocity (in m/sec)}] + [0.203^* \text{temperature (in °C.)}]$$

wherein the velocity is 15 to 30 meter/second and the temperature is 120° C. to 330° C. of the jet of heated gas. In other embodiments as one or more of the dimensions of the aperture in the form of a slot or open slit change, the equation for determining the heat flux may change.

Figure 6:
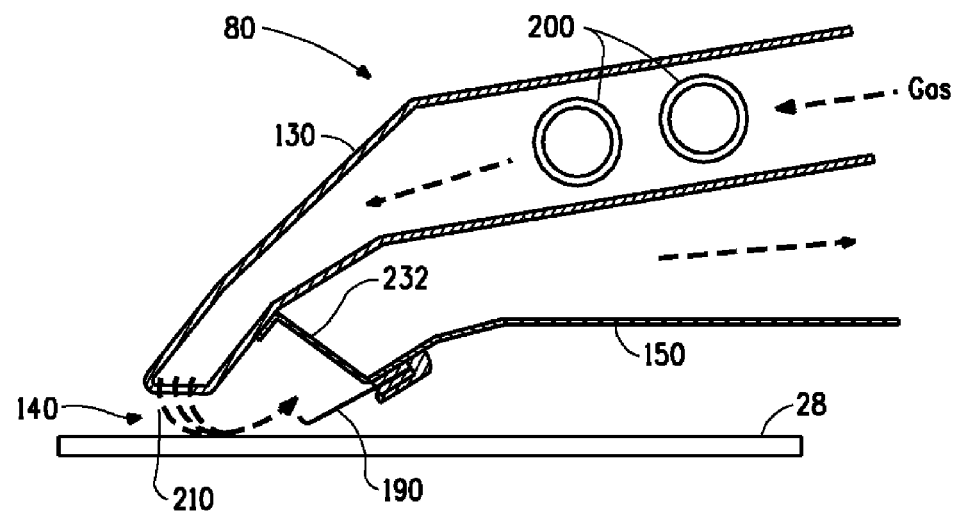
FIG. 6 is an enlarged cross-sectional view of another embodiment of the exit portion of an embodiment of a nozzle assembly shown in FIG. 2.

FIG. 6 shows another embodiment of the gas exit 140 of the nozzle assembly 80 shown in FIG. 2, in which a plurality of openings forms the embodiment of slot 210 of the nozzle assembly 80. Since the gas exit 140 has a length to impinge gas on the transverse portion of the surface 28, the slot 210 of the plurality of openings may be considered a linear array of the plurality of openings. This embodiment may have more structural integrity than the open embodiment of the slot 210 in FIG. 5, permitting the elimination of support 220. In addition, a rib 232 is similar to the rib 230 of FIG. 5, but the rib 232 does not extend to gas exit 140 as the plurality of openings embodiment of slot 210 provides more structural rigidity. In one embodiment when the gas exit 140 has the plurality of openings form of the slot 210, heat flux of the jet of heated gas (expressed in kW/m$^2$) may be represented by the following equation (EqnB):

$$\text{heat flux} = -33.3 \text{ (kW/m}^2\text{)} + [1.77 \text{ (kW-sec/m}^3\text{)}]*\text{velocity (m/sec)}] + [0.189 \text{ (kW/m}^{2\circ}\text{ C.)}*\text{temperature (}^\circ\text{ C.)}] \quad \text{(EqnB)}$$

wherein the velocity is 15 to 30 meter/second and the temperature is 120° C. to 330° C., of the heated gas. This same equation for determining the heat flux (in kW/m$^2$) of the jet of heated gas for a nozzle assembly having a plurality of openings that form the slot can be more simply expressed (by removal of units) as $$\text{heat flux} = -33.3 + [1.77*\text{velocity (in m/sec)}] + [0.189*\text{temperature (in }^\circ\text{ C.)}]$$

wherein the velocity is 15 to 30 meter/second and the temperature is 120° C. to 330° C. of the jet of heated gas. In other embodiments as one or more of the dimensions of the aperture in the form of a plurality of openings change, the equation for determining the heat flux may change.

In this embodiment the above equations for determining heat flux of the jet of heated gas were each based upon data collected from tests conducted over a period of time in which heat flux was measured under a variety of operating nozzle conditions for each of the slot 210 designs (i.e., open slit, and plurality of holes) for the gas exit 140 of the nozzle assembly 80 as described above. The tests were conducted at dwell times and with gaps (between the gas exit 140 the exterior surface 28) that are representative of expected operational use of the present thermal development system. From the collected data, a linear regression analysis was done to fit an equation to the data relative to the velocity and the temperature of the jet of heated gas exiting the nozzle, and applicable operating ranges for velocity and temperature were determined. Each equation applies to a particular design of the nozzle since the equation does not include all possible nozzle parameters, such as slot opening dimensions, number, and spacing; the gap between the gas exit and exterior surface; and, the dwell time. Different linear regression equations to predict or determine heat flux of the jet of heated gas impinging upon the exterior surface of the precursor could be generated from testing data based on one or more changes to nozzle parameters, gap, and dwell times. In alternate embodiment, it is contemplated that heat flux of the jet of heated gas can be determined from an equation based on designed experiment that varies operating parameters of the thermal development system that includes the air nozzle assembly over a wide range of conditions.

Figure 7:
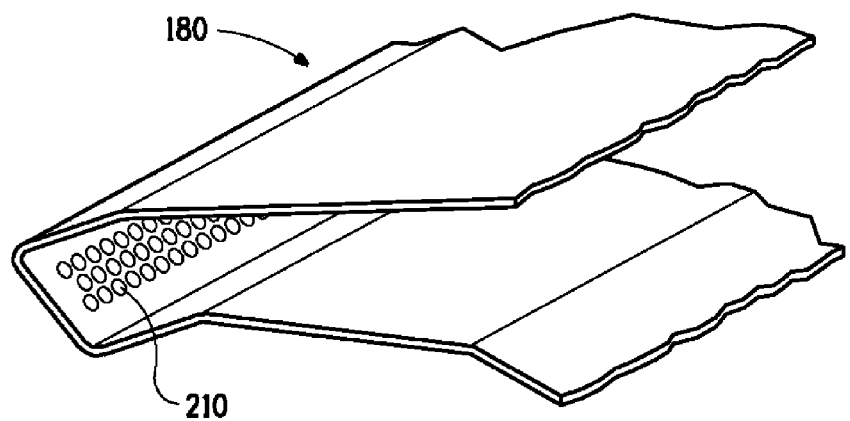
FIG. 7 is a perspective view of an interior edge exit portion of the nozzle assembly shown in FIG. 6, with portions broken away.

FIG. 7 shows a top interior edge exit portion of the tip 180 of nozzle assembly 80 shown in FIG. 2, showing an embodiment of the slot 210 that forms a linear array of the plurality of holes.

Figure 8:
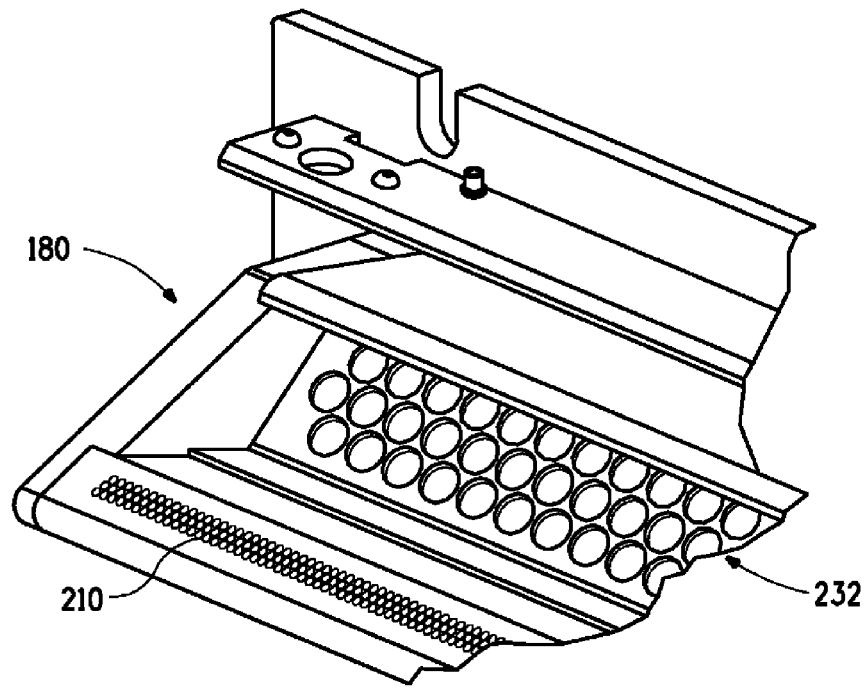
FIG. 8 is an expanded perspective view of an interior edge exit portion of the nozzle assembly shown in FIG. 7, with portions broken away.

FIG. 8 shows a bottom interior edge portion of the tip 180 where the rib 232 allows gas flow through the recycle 150. The plurality of holes embodiment for the slot 210 can have very small openings in comparison to those of the rib 232.

Figure 9:
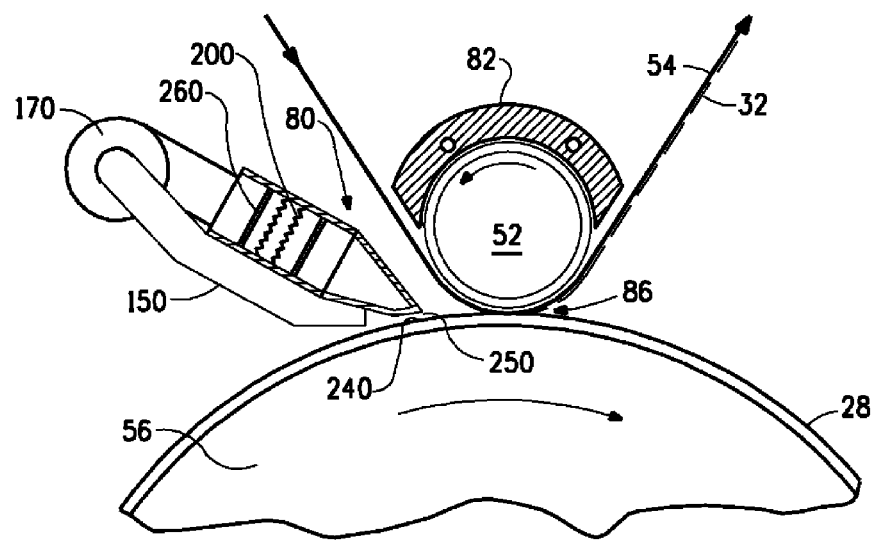
FIG. 9 is a partial cross-sectional side view of one embodiment of a printing form precursor subsystem for a thermal development apparatus and process for preparing a printing form, showing the orientation of the nozzle assembly, drum, and pressure roll.

FIG. 9 shows one embodiment the orientation of the nozzle assembly 80, drum 56, and pressure roll 52. An impingement point 240 notes the stagnation point of gas flow. A gap 250 denotes the distance between gas exit 140 and surface 28. Distance between gas exit 140 (not shown) and pressure roll 52 can be represented by distance between impingement point 240 and a nip 86. This distance in conjunction with the surface transport speed of the drum 56 (or other precursor support member) determines the dwell time. In the embodiment shown, heating elements form the heating means 200 and one or more distribution plate(s) 260 influence gas flow.

Figure 10:
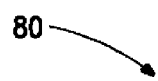
FIG. 10 is an enlarged cross-sectional view of one embodiment of the exit portion of the nozzle assembly of FIG. 2, showing a range of an angle of orientation of the exit portion of relative to a tangent at an impingement point of a surface.
Figure 10:
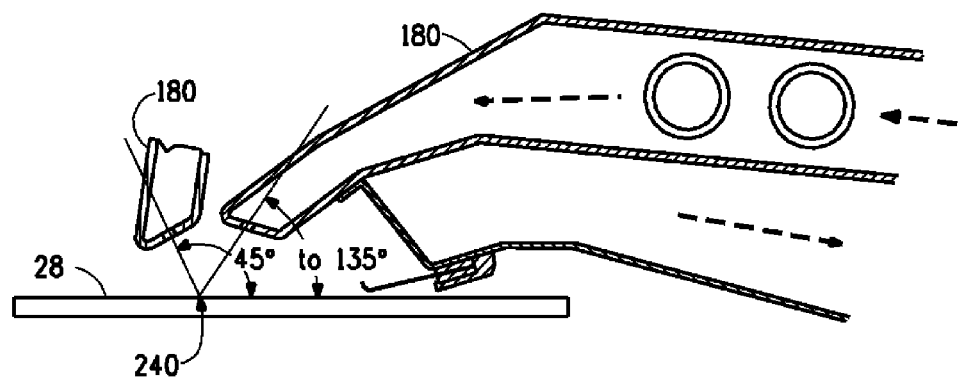

FIG. 10 shows angular variation of tip 180 of nozzle assembly 80, direction of gas flow may vary between about 45° and about 135° relative to a tangent line at impingement point 240 on surface 28. The nozzle assembly can be positioned or oriented within the apparatus 20 so that the direction of gas flow exiting from the tip 180 can impinge the surface 28 at an angle from about 45° to about 135°, relative to a tangent line at the impingement point 240. In some embodiments, the direction of gas flow exiting from the tip 180 can impinge the precursor from about 75° to about 110° relative to the tangent at the impingement point 240. In the embodiment shown, the gas exit 140 continues to direct the gas to the same or substantially the same impingement point 240 on the exterior surface 28 of the precursor, when oriented at 45° and at 135°. In some embodiments, the nozzle assembly 80 is oriented so that the gas exit 140 directs the jet of heated gas at the same or substantially the same angle relative to the tangent line at the impingement point 240 throughout all cycles of thermal development for a precursor. In some other embodiments, the nozzle assembly is oriented so that the gas exit 140 can direct the jet of heated gas at more than one angle relative to the tangent line at the impingement point throughout all cycles of thermal development for a precursor. In yet other embodiments, the nozzle assembly is oriented so that the gas exit 140 can direct the jet of heated gas at one or more angles relative to the tangent line at the impingement point and/or is moved to a different impingement point through the cycles of thermal development for a precursor.

One embodiment of the integration of the nozzle assembly 80 into the thermal development is shown in FIG. 1, and an explanation of the thermal development process is presented below.

In the embodiment shown in FIG. 1, the thermal development system 20 preferably includes a web subsystem 34, a foil subsystem 36, a waste subsystem 38, and a printing form subsystem 40. Each of the subsystems is described in further detail below. The thermal development system 20 according to the present method apparatus incorporates new features in the printing form precursor subsystem 40, in particular the nozzle assembly 80, which is used for heating the surface 28 for contacting by the development medium.

The web subsystem 34 continuously supplies the web 32 of development medium, preferably an absorbent web, through the thermal development system 20. It will be appreciated that web 32 may be comprised of any material, nonwoven or woven, capable of transferring unexposed portions of a printing form away from the printing form precursor 22. The purpose of the web is to contact precursor 22 and remove the molten unexposed portion of the printing form during thermal processing. The web subsystem 36 preferably includes a supply roll 42 and rollers 42, 44, 46, 48, and 50. The absorbent web 32 is unwound from the supply roll 42 and passes between rolls 44, 46, 48, and 50 in a serpentine path. As is described further below, the web 32 is then guided over a pressure roller 52 where it is mated with a foil 54, which is supplied from the foil subsystem 36, and is contacted to the exterior surface 28 of the printing form precursor 22. The precursor 22 is mounted to the drum 56 of the printing form subsystem 40.

The foil subsystem 36 preferably supplies a polymeric film or foil to mate with the absorbent web 32 and form the development medium for contacting with the printing form precursor 22. The purpose of the foil 54 is to protect portions of the thermal development system 20 from the molten unpolymerized portion of the printing form precursor 22 and other volatiles that are released during the development process. While web 32 absorbs much of the molten portion of the printing form precursor 22, it is possible that the molten material could, without the presence of the foil 54 penetrate the web 32, creating deposits on the pressure roller 52 and other rolls within waste subsystem 38. The foil 54 prevents the creation of these deposits and further prohibits the condensation of volatiles on parts of the thermal development system 20. Although the foil 54 can be any suitable material, the foil is most preferably a polyethylene terephthalate (PET) foil. In the embodiment shown, the foil subsystem 36 includes a supply roll 58 and rollers 60, 62, and 64. The foil 54 is unwound from the supply roll 58 and passes between rolls 60, 62, and 64 in a serpentine path. The foil 54 is then guided over the pressure roller 52 where it is mated with absorbent web 32 such that the foil 54 is pressed against the web 32, which is pressed against the printing form precursor 22.

The waste subsystem 38 is for collecting the used web 32 and foil 54. The waste subsystem 38 preferably includes rollers 66, 68, 70, 72, 74, and 76. Rollers 66, 68, 70, 72, 74, and 76 are take-up rollers that provide a serpentine path for the web and the foil after they have been pressed against each other in the printing form subsystem. Roller 76 is a waste take-up roller around which the web 32 and the foil 54 are collected.

One or more of the rolls 44, 46, 48, 50, 66, 68, 70, 72, 74 as well as take-up roll 76 may drive the web 32. One or more of the rolls 60, 62, 64, 66, 68, 70, 72, 74 as well as take-up roll 76 may drive the foil 54. One or more of the rolls 44, 46, 48, 50, 60, 62, 64, 66, 68, 70, 72, 74 or even the supply rolls 42 and 58 may include a braking mechanism to maintain tension of the web 32 and foil 54 in its transport path. The brake may be an electronic brake of the type known in the art. Further, the number of rollers and the path of the web and the foil are shown by way of example, and any number of rollers and paths can be used.

The printing form subsystem 40 preferably includes drum 56, cooling system 78, nozzle assembly 80, pressure roller 52, radiant heaters 82, arms 84, and nip 86. Drum 56 is the attachment point for printing form precursor 22 during the thermal development process. Drum 56 is used to rotate the printing form precursor 22 against the web 32 of the development medium so that the unexposed molten polymer may be removed. Drum 56 has a generally cylindrical shape and comprises surface 88. Drum 56 is mounted for rotation on a stationary support frame (not shown). In this embodiment, the drum 56 rotates in a counterclockwise direction as indicated by arrow 56a. It will be apparent to those skilled in the art that the thermal development system 20 can be configured so that the drum 56 rotates in the clockwise direction. The drum 56 is non-flexible or substantially non-flexible such that the drum 56 does not significantly change shape during the thermal development process.

In one embodiment, drum 56 further comprises cooling system 78. Cooling system 78 is preferably a water cooling system wherein cold water circulates within the drum so as to maintain the temperature of the backside or support of the printing form precursor 22 while it is touching the drum 56. In one embodiment, the support of the printing form precursor is maintained at a temperature less than the glass transition temperature of the support for the printing form, i.e., at less than 130° F. This ensures that the support does not distort and the printing form 22 retains its shape. As is disclosed in U.S. Pat. No. 6,797,454 B1, it is also possible that the drum be cooled by an alternative cooling means, such as a blower (not shown) directing a stream of air at the surface of the photosensitive printing form precursor 22 and the drum 56.

Printing form subsystem 40 may include the pressure roller 52 as another means for heating the printing form 22, in combination with the nozzle assembly 80. The pressure roller 52 maintains or further elevates the temperature of the exterior surface 28 of the printing form precursor 22, thereby ensuring that the undeveloped portion of the printing form is in a liquid state when in contact with web 32. Pressure roller 52 can be heated by radiant heaters 82, such as infrared heater/s. The pressure roller 52 can be heated by other heating means, such as a cartridge heater. The pressure roller 52 is positioned adjacent the drum 56 which carries the printing form 22. The pressure roller 52 is also adjacent the nozzle assembly 80.

Pressure roller 52 also acts as the means by which web 32 and foil 54 contact the exterior surface 28 of the printing form precursor 22. After web 32 and foil 54 pass through web subsystem 34 and foil subsystem 36, respectively, web 32 and foil 54 join by passing around pressure roller 52 along a serpentine path. As web 32 and foil 54 pass pressure roller 52, web 32 is pressed against the exterior surface 28 of printing form precursor 22, thereby absorbing the molten unexposed portion of the precursor 22.

Alternatively, in conjunction with the gas jet heating from the nozzle assembly 80, the drum 56 may also be equipped with a drum heater (not shown). The drum heater (not shown) may be used to keep the photosensitive printing form 22 at a stable starting temperature independent of the surrounding environment during thermal development so that the undeveloped portion of the printing form remains in a molten state and can be absorbed by web 32. The drum heater (not shown) may be an electrical heating blanket, such as a wire wound blanket. However, any means of heating the drum 56 is acceptable, as long as the power capacity of the heater is sufficient to maintain a fairly constant selected skin temperature on the exterior surface 88 of the drum 56. It is also contemplated that a heating fluid, such as water, may be circulated beneath the surface of the drum 56 to heat the drum.

In the preferred embodiment shown, the temperature of the exterior surface 88 of the drum is about 50° to 150° F. (10° C. to 65.6° C.), preferably 75° F. to 95° F. (23.9° C. to 35° C.). These parameters are illustrative and the parameters can be adjusted to fit the specific application. If the normal operating environment is carefully controlled to be at a constant temperature, the heater can be turned off or omitted from the drum 56.

Printing form subsystem 40 further comprises arms 84 which provide a means for relative motion between the drum 56 and the pressure roller 52. Arms 84 function so that the photosensitive printing form precursor 22 and the web 32 of development medium can be brought into contact with the other. Means for providing relative movement can be accomplished, for example, by mounting the pressure roller 52 (and/or drum 56) onto arms 84 attached to a two-position pneumatic roll loading cylinder/s 83 that moves the pressure roller 52. In alternative embodiments, relative movement of the pressure roller 52 may be actuated by stepping motors or servo motors. Temperature sensors may also be mounted throughout the thermal development system 20 to monitor the temperature for the purpose of controlling the heat input by and nozzle assembly 80, pressure roller 52, and optionally the drum 56.

The nip 86, or distance between the pressure roller 52 and the drum 56, when the pressure roller 52 is in the engaged position for this embodiment, is preferably zero centimeters. It is desirable to set the distance such that a substantially uniform pressure is applied to the nip 86 of the exterior surface 28 of the precursor 22 during processing. Pressure is applied to force the absorbent web into intimate contact with the photosensitive printing form precursor 22. It will be appreciated that the nip 86 can be adjusted to a different parameter to suit any particular application.

The nozzle assembly 80 acting independently, or in combination with the pressure roller 52, is capable of heating the exterior surface 28 of the photosensitive printing form precursor 22 to a temperature sufficient to cause a portion, i.e., an unexposed portion, of the composition layer to liquefy, soften, flow, or melt. In one embodiment, the jet of heated gas is used for heating the exterior surface of the precursor to a temperature sufficient to cause a portion of the layer to liquefy, soften, flow, or melt. In another embodiment, the nozzle assembly 80 creates the jet of heated gas to act as a first heating means, and the pressure roller 52 that is heated to act as second heating means are used for heating the exterior surface 28 of the photosensitive printing form precursor 22 to a temperature sufficient to cause a portion, i.e., an unexposed portion, of the composition layer to liquefy, soften, or melt. Additional and alternate methods of heating the printing form precursor 22 are possible and inclusion into the present system and method is within the skill of those in the art. Cooling system 78 may be used to cool the backside surface, e.g., support, of the printing form 22 to ensure that the printing form retains its shape during thermal processing.

Method

The method of the present invention includes heating the exterior surface of the precursor to a temperature sufficient to cause a portion of the layer to liquefy and form liquefied material by using a jet of heated gas emitting from a nozzle assembly at a velocity of 10 to 35 meter/second and temperature of 110° C. to 360° C., and impinging the exterior surface at a heat flux greater than or equal to 10 kiloWatts/m$^2$ (kW/m$^2$) for a dwell time of less than 15 seconds; and, contacting the photosensitive element with a development medium to allow the liquefied material to be removed by the development medium. Both heating of uncured portions with the jet of heated gas and contact of the heated uncured portions with a development medium are needed in order to remove the uncured material in depth from the photopolymerizable layer of the precursor. Heating with a jet of heated gas alone is insufficient to drive the separation of the uncured portions, which are excessively viscous, e.g., greater than 100,000 cP, even at the elevated temperatures for thermal development, from the cured portions in photopolymerizable layers that are relatively thick, i.e., about 0.35 mm and about 7.6 mm thick.

The operation of the apparatus for the process of thermally developing the photosensitive printing form precursor 22 is described in reference to the embodiment of the thermal development apparatus 20 shown in FIG. 1. The thermal development system 20 is in a home position with the drum 56 stationary and adjacent the feed tray 96. A support member 98 was previously mounted onto the drum 56. Alternatively, the drum 56 is constructed with a support member 98 that is integral to the drum 56. The support member 98 includes an exterior surface 88. The operator places the photosensitive printing form precursor 22 on feed tray 96. An operator then engages the printing form precursor 22 on drum 56, by attaching each of the lead portion 24 of the precursor to the surface 88 of the drum 56 and trail portion 26 to an engaging member on a rotatable arm 104. The nozzle assembly 80 alone or in combination with the optional drum heater (not shown) may be used to preheat the drum 56. Cooling system 78 may also be used to cool the drum 56. The pressure roller 52 is heated by one or more radiant heaters 82. The drum 56 starts turning and carries the printing form precursor 22 with it so that the photosensitive printing form precursor 22 is adjacent the support member 98. The nozzle assembly 80 may be preheated before the printing form precursor 22 reaches the nozzle assembly 80, and then switched to an operating setting to achieve the desired temperature for melting, softening, flowing, or liquefying the composition layer on the printing form precursor 22. After the lead portion 24 of the printing form 22 passes the position where the pressure roller 52 will contact the drum 56, the pneumatic roll loading cylinder/s 83 moves the arms 84 attached to the pressure roller 52 thereby carrying the absorbent web 32 and foil 54 against the printing form precursor 22. The jet of heated air from the nozzle assembly 80 alone, or in combination with the heated pressure roller 52, heats the surface 28 of the precursor 22 to cause a portion of the layer of the photopolymerizable composition to soften, melt, flow, or liquefy. The layer of the photopolymerizable composition is heated to a temperature from 40° C. to 230° C. (104° F. and 392° F.), inclusive, to soften or melt uncured portions of the layer. (These parameters are illustrative). The absorbent web 32 of the development medium contacts the exterior surface 28 of the printing form precursor 22, and removes by absorbing, blotting, or wicking away the liquefied portions of the uncured polymeric material from the unexposed portions of the composition layer, forming a relief surface having raised portions and recessed portions. The relief surface is suitable for use as a relief printing form, particularly a flexographic printing form. By maintaining more or less intimate contact of the absorbent web 32 of the development medium with the printing form precursor 22 that is molten in the uncured regions, a transfer of the uncured photosensitive material from the printing form precursor 22 to the development web 32 takes place. While still in the heated condition, the development web 32 is separated from the cured printing form 22 to reveal the relief structure having raised portions and recessed portions.

As the trailing portion of the printing form precursor 22 passes the pressure roller/drum contact point, i.e., nip 86, the nozzle assembly 80 may cool down or turn off, the pneumatic roll loading cylinder 83 will retract the pressure roller 52, and travel of the web 32 and foil 54 can be stopped. The drum 56 may return the lead portion 24 of the printing form precursor 22 to the home position to begin another cycle of heating and contacting. A cycle of the steps of heating the printing form precursor 22 to soften, melt or liquefy the exterior surface 28 and contact the molten portions with the development medium can be repeated as many times as necessary to adequately remove the uncured material and create sufficient relief depth. However, it is desirable to minimize the number of cycles for suitable system performance, and typically the photopolymerizable printing form is thermally treated for 5 to 15 cycles. Intimate contact of the development material to the composition layer (while the uncured portions are melting or liquefying) may be maintained by the pressing the layer and the development medium together.

In most embodiments of the operation of the thermal development processor the heat flux of the impinging jet of heated air is not measured. Given a particular nozzle assembly and configuration relative to the surface of the precursor on the drum, the heat flux of the jet of heated gas for suitable thermal development is established to operate in about 10 to 70 kW/m². Given a particular nozzle assembly and configuration relative to the surface of the precursor on the drum, in most embodiments the heat flux of the jet of heated gas is established to operate at a particular heat flux or within a preferred range of heat flux that is suitable to thermally develop a variety of photopolymerizable printing form precursors (variety according to types, photopolymerizable layer thicknesses, sizes, etc.) by easy adjustment of one or more operational conditions of the system, including but not limited to temperature of the jet of heated air, speed of air created by the blower, gap spacing of the nozzle exit to the precursor surface, transport speed of the drum or support that carries the precursor, tensions of the web/s for the development medium, load of the pressure roll, etc. Even though surface speed of the drum does not affect heat flux of the jet of heated air generated (i.e., rate of delivery of the air to the precursor), but a change to drum surface speed changes the total amount of heat delivered to the precursor. As such, the surface speed of the drum may also be changed to accommodate the thermal development need/s of a particular precursor/s.

In some embodiments, the exterior surface 28 of the precursor 22 is polished by one or more final passes of the precursor 22 by the jet of heated air from the nozzle assembly 80. After the development cycles are completed to remove the uncured material and provide a suitable relief depth in the resulting printing form, the pressure roller 52 is retracted creating a gap at the nip 86 between the pressure roller 52 and the drum 56, so that the development medium does not contact the precursor 22 for the polishing cycle or cycles. The rotation of the pressure roller 52 and travel of the web 32 and foil 54 can also be stopped. The drum 56 returns the lead portion 24 of the printing form 22 to the home position to begin the polishing cycle. The nozzle assembly 80 continues to impinge the jet of heated air on the surface 28 of the printing form precursor 22 that is transporting on the drum 56 to smooth or polish the surface 28 of the resulting printing form. In some embodiments, the polishing cycle of impingement of the jet of hot air eliminates or minimizes or reduces one or more marks on the relief surface, which includes the recessed portions and the raised portions. In some other embodiments, the polishing cycle of impingement of the jet of hot air eliminates or minimizes or reduces one or more marks on of the uppermost surface of the raised portion/s of surface 28. Impingement of the jet of heated air onto the surface of the precursor without subsequent contact to the development medium is a polishing cycle (or smoothing cycle). The polishing cycle can be repeated one or more times as needed to attain the desired relief surface appearance and characteristics.

Photosensitive Element

In one embodiment, the photosensitive element includes a flexible substrate and a composition layer mounted on the substrate. The composition layer is at least one layer on the substrate capable of being partially liquefied. In one embodiment, the photosensitive element is an elastomeric printing element suitable for use as a flexographic printing form. In another embodiment, the photosensitive element is a relief printing form suitable for use in letterpress printing. In another embodiment, the photosensitive element is a relief printing form suitable for gravure-like printing. The at least one layer on the substrate is preferably a photosensitive layer, and most preferably a photopolymerizable layer of an elastomeric composition wherein the photosensitive layer can be selectively cured by actinic radiation. As used herein, the term "photopolymerizable" encompasses systems that are photopolymerizable, photocrosslinkable, or both. In cases where the composition layer comprises more than one photosensitive layer on the flexible substrate, the composition of each of the photosensitive layers can be the same or different from any of the other photosensitive layers.

In most embodiments, the photopolymerizable composition forms a solid layer that can be imagewise exposed and treated with heat to form a relief suitable for printing. As used herein, the term "solid" refers to the physical state of the layer that has a definite volume and shape and resists forces that tend to alter its volume or shape. The layer of the photopolymerizable composition is solid at room temperature, which is a temperature between about 5° C. and about 30° C. A solid layer of the photopolymerizable composition may be polymerized (photohardened), or unpolymerized, or both.

Unless otherwise indicated, the terms "photopolymerizable element", "printing form precursor", and "printing form" encompass elements or structures in any form suitable for printing, including, but not limited to, flat sheets, plates, seamless continuous forms, cylindrical forms, plates-on-sleeves, and plates-on-carriers. It is contemplated that printing form resulting from the photopolymerizable element has end-use printing applications for relief printing, such as flexographic and letterpress printing. The photopolymerizable element may also be referred to herein as a photosensitive element, and can be considered a precursor to the relief printing form.

The solid layer of the photosensitive composition is capable of partially liquefying upon thermal treatment. That is, during thermal treatment the unirradiated portion, i.e., uncured portion of the composition must soften or melt or flow at a reasonable processing or developing temperature but not be subject to cold flow, i.e., dimensional change, during normal storage. At least a portion of the exterior surface of the composition layer is heated to a temperature sufficient to cause a portion of the layer to liquefy, soften, or melt or flow. If the photopolymerizable element includes one or more additional layers on the photopolymerizable layer, it is preferred that the one or more additional layers are also removable in the range of acceptable developing temperatures for the photopolymerizable layer.

The photosensitive layer includes at least one monomer and a photoinitiator, and optionally a binder. The at least one monomer is an addition-polymerizable ethylenically unsaturated compound with at least one terminal ethylenic group. Monomers that can be used in the photosensitive layer are well known in the art and include monofunctional acrylates and methacrylates, multifunctional acrylates and methacrylates, and polyacryloyl oligomers. Further examples of monomers can be found in U.S. Pat. Nos. 4,323,636; 4,753,865; and 4,726,877. A mixture of monomers may be used.

The photoinitiator is a compound that generates free radicals upon exposure to actinic radiation. Any of the known classes of photoinitiators, particularly free radical photoinitiators may be used. Alternatively, the photoinitiator may be a mixture of compounds, one of which provides the free radicals when caused to do so by a sensitizer activated by radiation.

The optional binder is a preformed polymer that serves as a matrix for the monomer and photoinitiator prior to exposure and is a contributor to the physical properties of the photopolymer both before and after exposure. In one embodiment the optional binder is elastomeric. A non-limiting example of an elastomeric binder is an A-B-A type block copolymer, where A represents a nonelastomeric block, preferably a vinyl polymer and most preferably polystyrene, and B represents an elastomeric block, preferably polybutadiene or polyisoprene. Other suitable photosensitive elastomers that may be used include polyurethane elastomers, such as those described in U.S. Pat. Nos. 5,015,556 and 5,175,072. The monomer or mixture of monomers must be compatible with the binder to the extent that a clear, non-cloudy photosensitive layer is produced.

Additional additives to the photosensitive layer include colorants, processing aids, antioxidants, and antiozonants.

The photosensitive element may include one or more additional layers on the side of the photosensitive layer opposite the substrate. Examples of additional layers include, but are not limited to, a release layer, a capping layer, an elastomeric layer, a laser radiation-sensitive layer, an actinic radiation opaque layer, a barrier layer, and combinations thereof. The one or more additional layers preferably are removable, in whole or in part, by contact with the development medium in the range of acceptable developing temperatures for the photosensitive element used. One or more of the additional other layers can cover or only partially cover the photosensitive composition layer. An example of an additional layer which only partially covers the photosensitive composition layer is a masking layer that is formed by imagewise application, e.g. ink jet application, of an actinic radiation blocking material or ink.

The photosensitive element of the present invention may further include a temporary coversheet on top of the uppermost layer of the photosensitive element. One purpose of the coversheet is to protect the uppermost layer of the photosensitive element during storage and handling. Depending upon end use, the coversheet may or may not be removed prior to imaging, but is removed prior to development. Suitable materials for the coversheet are well known in the art.

The substrate is selected to be tear resistant and must have a fairly high melt point, for example, above the liquefying temperature of the composition layer formed on the substrate. The material for the substrate is not limited and can be selected from polymeric films, foams, fabrics, and metals such as aluminum and steel. The substrate can be almost any polymeric material that forms films that are non-reactive and remain stable throughout the processing conditions. Examples of suitable film supports include cellulosic films and thermoplastic materials such as polyolefins, polycarbonates, and polyester. The shape of the support is not limited. The support may be in sheet form or in cylindrical form, such as a sleeve. The sleeve may be formed from single layer or multiple layers of flexible material. Flexible sleeves made of polymeric films are preferred, as they typically are transparent to ultraviolet radiation and thereby accommodate backflash exposure for building a floor in the cylindrical printing element. Multiple layered sleeves are also acceptable and may include an adhesive layer or tape between the layers of flexible material. The sleeve may also be made of non-transparent, actinic radiation blocking materials, such as nickel or glass epoxy. The sleeve typically has a wall thickness from 10 to 80 mils (0.025 to 0.203 cm) or more. Preferred wall thickness for the cylinder form is 10 to 40 mils (0.025 to 0.10 cm). The substrate of the photosensitive element has a thickness of between about 0.01 mm and about 0.38 mm. The radiation curable composition layer is between about 0.35 mm and about 7.6 mm thick, with a preferred thickness of about 0.5 mm to 3.9 mm (20 to 155 mils).

The photosensitive element is prepared for thermal development by imagewise exposing the element to actinic radiation. After imagewise exposure, the photosensitive element contains cured portions in the exposed areas of the radiation curable composition layer and uncured portions in the unexposed areas of the radiation curable composition layer. Imagewise exposure is carried out by exposing the photosensitive element through an image-bearing mask. The image-bearing mask may be a black and white transparency or negative containing the subject matter to be printed, or an in-situ mask formed with the laser radiation sensitive layer on the composition layer, or other means known in the art. Imagewise exposure can be carried out in a vacuum frame, or may be conducted in the presence of atmospheric oxygen, or may be conducted in a controlled environment having an inert gas and a concentration of oxygen less than atmospheric oxygen. On exposure, the transparent areas of the mask allow addition polymerization or crosslinking to take place, while the actinic radiation opaque areas remain un-crosslinked. Exposure is of sufficient duration to crosslink the exposed areas down to the support or to a back exposed layer (floor). Imagewise exposure time is typically much longer than backflash time, and ranges from a few to tens of minutes. For direct-to-plate image formation as disclosed in U.S. Pat. No. 5,262,275; U.S. Pat. No. 5,719,009; U.S. Pat. No. 5,607,814; U.S. Pat. No. 5,506,086; U.S. Pat. No. 5,766,819; U.S. Pat. No. 5,840,463 and EP 0 741 330 A1 the image-bearing mask is formed in-situ with the laser radiation sensitive layer using an infrared laser exposure engine.

Actinic radiation sources encompass the ultraviolet, visible and infrared wavelength regions. The suitability of a particular actinic radiation source is governed by the photosensitivity of the initiator and the at least one monomer used in preparing the flexographic printing plates from the photosensitive element. The preferred photosensitivity of most common flexographic printing plates is in the UV and deep visible area of the spectrum, as they afford better room-light stability. The portions of the composition layer that are exposed to radiation chemically cross-link and cure. The portions of the composition layer that are unirradiated (unexposed) are not cured and have a lower melting or liquefying temperature than the cured irradiated portions. The imagewise exposed photosensitive element is then ready for heat development with the absorbent material to form a relief pattern.

An overall back exposure, a so-called backflash exposure, may be conducted before or after the imagewise exposure to polymerize a predetermined thickness of the photopolymer layer adjacent the support. This polymerized portion of the photopolymer layer is designated a floor. The floor thickness varies with the time of exposure, exposure source, etc. This exposure may be done diffuse or directed. All radiation sources suitable for imagewise exposure may be used. The exposure is generally for 10 seconds to 30 minutes.

Following overall exposure to UV radiation through the mask, the photosensitive printing element is thermally developed as described above to remove unpolymerized areas in the photopolymerizable layer and thereby form a relief image. The thermal development step removes at least the photopolymerizable layer in the areas which were not exposed to actinic radiation, i.e., the unexposed areas or uncured areas, of the photopolymerizable layer. Except for the elastomeric capping layer, typically the additional layers that may be present on the photopolymerizable layer are removed or substantially removed from the polymerized areas of the photopolymerizable layer. After thermal development, the flexographic printing form may be post exposed and/or chemically or physically after-treated in any sequence to complete the photopolymerization and detackify the surface of the flexographic printing form.

The present invention is particularly applicable to photosensitive elements having solid layer of a photopolymerizable composition as described above. Photosensitive elements having a solid layer of a photopolymerizable composition suitable for forming relief printing forms as disclosed herein.

As used herein, the term "solid" refers to the physical state of the layer that has a definite volume and shape and resists forces that tend to alter its volume or shape. The photopolymerizable layer of the photosensitive element is generally considered a solid at room temperature. At temperatures above room temperature, photosensitive elements having a (uncured) photopolymerizable layer as disclosed herein, typically exhibit dynamic viscosities for the uncured photopolymerizable layer in the range of about 15,000,000 to about 45,000,000 cP at 75° C. and 0.5 Hz, and in the range of about 5,000,000 to about 15,000,000 cP, at 100° C. and 0.5 Hz. Viscosities in the range of 5,000,000 to 10,000,000 cP have consistency that is similar to caulking compound. In some instances, some photopolymerizable materials exhibit a viscosity of about 856,000 cP at 150° C. Note that 1 centipoise (cP) is 0.001 Pascal-second (Pa-s). Centipoise is properly abbreviated cP, but the alternative abbreviations cps, cp, and cPs are also commonly seen. As described herein, heating of the exterior surface of the solid photopolymerizable layer causes the uncured portions of the solid layer to soften, melt, flow, or liquefy, thereby exhibit dynamic viscosity in the previously stated ranges. The present method and apparatus does not encompass using liquid photosensitive materials having a viscosity of 100 to 10000 cps between room temperature and 93° C., which are removed by a gas stream as disclosed in U.S. Pat. No. 4,197,126. Viscosities in the range of 100 to 10000 cps have consistency that is similar to motor oil and molasses. The dynamics of removing uncured portions of the solid photopolymerizable layer that soften, melt, or liquefy according to the present invention and have dynamic viscosities for the uncured photopolymerizable layer in the range of about 15,000,000 to about 45,000,000 cP at 75° C. and 0.5 Hz, and in the range of about 5,000,000 to about 15,000,000 cP, at 100° C. and 0.5 Hz, are substantially different from removal of uncured liquid portions having viscosities of 100 to 10000 cps between room temperature and 93° C. Even for removal of uncured portions of photopolymerizable material having a viscosity on the order of 856,000 cP at 150° C., which would have a consistency similar to peanut butter or lard, the dynamics would be significantly different from removal of uncured liquid portions with viscosity up to 10000 cps at temperature up to 93° C.

For the purposes of the present invention, the terms "melt", "liquefy", "soften", and "flow" in reference to the unirradiated portions (i.e., uncured portions) of the solid photopolymerizable composition layer of the precursor that at least soften and reduce its viscosity when subjected to an elevated temperature (e.g., about 40° C. to about 230° C.) to permit removal by a development medium, are considered substantially equivalent; and, are considered to represent the heated unirradiated (i.e., uncured) portions that have viscosity of greater than 100,000 cP, greater than 500,000 cP in most embodiments, greater than 800,000 cP in some embodiments, greater than 1,000,000 cP in some other embodiments, and greater than 5,000,000 cP in yet other embodiments.

EXAMPLES

Example 1

The following example demonstrates that uncured photopolymerizable material is removed from a photosensitive element by nozzle assembly heating of an exterior surface of the photosensitive element and contacting of the element with a development medium.

The photosensitive elements used were CYREL® flexographic printing elements, types 67DFM (67 mils), 45DFH (45 mils), and 45 DFQ (45 mils). (The thickness indicated in the parenthesis after each type represents the total thickness of photopolymerizable layer and base support). An in-situ mask image was formed on each element by selective ablation of an infrared-sensitive, actinic radiation layer with a CYREL® Digital Imager. The mask image was the same for all elements, and included line work and screen areas. The elements were exposed on a CYREL® exposure unit, 2000ECLF, to ultraviolet radiation at 365 nm for an overall exposure through the support and for imagewise exposure through an in-situ mask in air, for the times indicated in the Table 1.

The photosensitive elements were processed in a thermal development test bed apparatus substantially as shown in FIG. 1 having a support drum for supporting the elements during thermal development, a hot roller capable of supporting a multilayer web in contact with an exterior surface of the elements, and a nozzle blower assembly oriented with its air exit at 90 degrees to impinge the exterior surface of the element. The multilayer web was composed of a polyester non-woven as an absorbent material and a polyethylene terephthalate film (0.5 mil) as a support that were individually supplied to the hot roller. Each web of the two materials was brought together into contact at the hot roller such that the support was adjacent the absorbent material and opposite the exterior surface of the photosensitive element, and the non-woven contacted the exterior surface of the photosensitive element, to provide a development medium at the nip. Thereafter, the multilayer web (or development medium) transported as one web to a take-up or waste roll.

Each of the elements was positioned and secured to the support drum, with the exterior surface of the element (i.e., surface opposite the base support) facing the air nozzle assembly and the hot roller carrying the development medium. All elements were thermally treated at the same processing conditions for all passes described as follows. The drum carrying the element was rotated at 30 inch per minute. The air nozzle assembly generated air at blower volume of 10 standard cubic feet per minute (SCFM), and temperature at the exit of the nozzle of 600° F. The exit of the air nozzle assembly was a slot (0.1 inch opening) which was positioned 3 mm from the exterior surface of the element. The number of passes was 10. Velocity of the air at the exit was 20 meter per second. The heat flux of the air nozzle assembly was 47 kiloWatt/m$^2$. The hot roller was heated externally to a temperature of 200° C. with heating bulbs of infrared radiation. For the plates of Example 1A, 1B, 1C a pass of the printing element in the thermal processor constituted heating the exterior surface of the element, contacting the element with a web of the development medium to remove unpolymerized portions, and separating the development medium from the element. The plate elements of Example 1A, 1B, and 1C were all preheated by the air emitting from the exit of the nozzle assembly, contacted with the development medium which was supported by the hot roller, and separated from the development medium which carried away portions of molten photopolymerizable material (i.e., unexposed portions of the photopolymerizable layer). For the plates of Comparative 1A, 1B, 1C a pass of the printing element in the thermal processor constituted heating the exterior surface of the element with the air nozzle assembly. The plate elements of Comparative 1A, 1B, and 1C were all heated by the air emitting from the exit of the nozzle assembly, but were not contacted by the development medium.

After the indicated number of passes, the relief depth was measured in several locations on the plate, averaged, and the average relief depth for each plate was recorded in Table 1.

TABLE 1

| Plate | | Back Exposure (seconds) | Main Exposure (minutes) | Average relief (mils) |
|---|---|---|---|---|
| 67DFM | Comparative 1A | 17 | 7 | 1 |
| 45DFH | Comparative 1B | 48 | 7 | 4 |
| 45DFQ | Comparative 1C | 50 | 7 | 0 |
| 67DFM | Example 1A | 17 | 7 | 24.5 |
| 45DFH | Example 1B | 48 | 7 | 26 |
| 45DFQ | Example 1C | 50 | 7 | 22 |

In general, unpolymerized polymer should be removed from the photopolymerizable layer of the precursor to a depth of about half of the thickness of the photopolymerizable layer in order to create a relief structure in the resulting printing plate that will effectively function for relief printing. The results clearly show that air from the nozzle assembly as described herein that impinges the exterior surface of the photosensitive element is not by itself sufficient to drive or remove molten photopolymerizable material from a photosensitive element to create a relief surface.

Example 2

The following example demonstrates heating of uncured photopolymerizable material from a photosensitive element with a nozzle assembly generating a jet of heated air and removing of the heated uncured material by contacting with a development medium supported by a heated roll, in which the jet of heated air has a heat flux that should be at least about 10 kiloWatt/m$^2$ in order to sufficiently soften, melt, or liquefy the photopolymerizable material for removal.

The photosensitive elements used were CYREL® flexographic printing elements, type 67DFM (67 mils). (The thickness indicated in the parenthesis represents the total thickness of photopolymerizable layer and base support). The photosensitive element had a size of 50 inch by 80 inch. The elements were exposed on a CYREL® exposure unit, 3000ETL, to ultraviolet radiation at 365 nm in air through the support to form a floor for 24 seconds at energy density of 14.3 mWatts/cm$^2$ for back exposure prior to thermal development. No imagewise exposure was given.

The photosensitive elements were processed in a thermal development full-scale apparatus substantially as shown in FIG. 1 having a support drum for supporting the elements during thermal development, a hot roller capable of supporting a multilayer web in contact with an exterior surface of the elements, and a nozzle blower assembly oriented with its air exit at about 90 degrees to impinge the exterior surface of the element. The candidate apparatus was capable of thermally developing full-size photosensitive elements into relief printing forms. The multilayer web was composed of a polyester non-woven as an absorbent material and a polyethylene terephthalate film (0.5 mil) as a support that were individually supplied to the hot roller. Each web of the two materials was brought together into contact at the hot roller such that the support was adjacent the absorbent material and opposite the exterior surface of the photosensitive element, and the non-woven contacted the exterior surface of the photosensitive element, to provide a development medium at the nip. Thereafter, the multilayer web (or development medium) transported as one web to a take-up or waste roll. The development medium web was under tension (from nip 86 to load roll 66) at a level that is normally used for thermal development processing of precursors.

Each of the elements was positioned and secured to the support drum, with the exterior surface of the element (i.e., surface opposite the base support) facing the air nozzle assembly and the hot roller carrying the development medium. Elements were thermally treated for each test at the processing conditions as follows, with the nozzle assembly at the conditions indicated in Table 3A below. The exit of the air nozzle assembly was a slot having a linear array of a plurality of openings which was positioned at the same distance for all tests at about 3 mm from the exterior surface of the element. The air nozzle assembly generated air at a blower volume and a temperature at the exit of the nozzle as indicated. The nozzle pressure was determined from a magnihellic gage, located midway in the plenum of the nozzle assembly. The velocity of the air was calculated from temperature, volume, pressure of the air at the exit based on the total area of the plurality of openings for the slot. The surface speed of the rotating drum carrying the element was 90 inch per minute. The temperature of the surface of the drum was maintained at 70° F. (21.1° C.). The hot roller was heated externally to a temperature of 390° F. (198.9° C.) with heating panels using infrared radiation. Unless otherwise noted, the load of the hot roll on the element was 85 pounds per linear inch.

For this Example, a pass of the printing element in the thermal processor constituted heating the exterior surface of the element with a jet of heated air emitting from the nozzle assembly, contacting the element with a web of the development medium, which was supported by a heated nip roll, to remove unpolymerized portions, and separating the development medium from the element to remove portions of the molten photopolymerizable material (i.e., uncured or unexposed portions of the photopolymerizable layer).

TABLE 3A

Nozzle Assembly Conditions

| | Jet Air Exit Temp (° C.) | Blower (RPM) | Nozzle Pressure (inch H$_2$O) | Blower Volume (SCFM) | Jet Air Velocity at Exit (m/s) |
|---|---|---|---|---|---|
| Test 1 | 110 | 1400 | 0.275 | 86 | 15 |
| Test 2 | 79 | 1250 | 0.24 | 83 | 13 |
| Test 3 | 79 | 1400 | 0.29 | 95 | 15 |
| Test 4 | 121 | 1400 | 0.25 | 91 | 16 |
| Test 5 | 121 | 1800 | 0.425 | 117 | 20 |

Results of each Test run is reported Table 3B below. For each Test, the conditions for the nozzle assembly to emit a jet of heated air were established and the drum, which supported the photosensitive element, was rotated passed the jet of heated air and the nip with the heated roll, which supported the development medium into contact with the exterior surface of the element. The failure or success of each Test was based upon occurrence of the web of the development medium sticking or not sticking, respectively, to the photosensitive element. In some instances, more than one photosensitive element was thermally processed at a particular set of Test conditions. If the uncured photopolymerizable material was removed by heating with the air nozzle and contacting with the development medium to the floor of the element, without web sticking, in 13 (or less) passes, the conditions for thermal development for the Test were at least acceptable.

Typically to reach the floor about 25 mils of uncured photopolymerizable material was removed from the element by the end of the last pass. If the web stuck to the photosensitive element when uncured photopolymerizable material was removed by heating with the air nozzle and contacting with the development medium, the conditions for thermal development for the Test was not acceptable. Tests that ended with the development web sticking to the photosensitive element typically occurred in the last or near the 13$^{th}$ pass. Uncured photopolymerizable material can be difficult to remove at or near the upper surface of the floor (opposite the support) at an interface between uncured and cured photopolymer material. At the interface the photopolymer material is partially cured, and thus the development medium can have a tendency to stick particularly if the surface is not heated sufficiently to cause the material at the interface to soften, melt, flow or liquefy. Since all other conditions for thermal development were held constant and only the conditions which influenced the jet of heated air were changed, web sticking to the photosensitive element was used as an indicator that the heat flux, that is the rate of heat energy transferred by the jet of heated air the surface of the photosensitive element, was insufficient.

The Measure Heat Flux reported in Table 3B was the heat flux that was measured on a test-bed unit (6 inch width) that was operated at the same or substantially the same conditions as for the full-scale unit, by placing a heat flux sensor mounted onto a piece of insulating material that is secured to the exterior surface of the drum. The heat flux sensors were model HFS-4, which is 6.5 µV/BTU/Ft$^2$Hr sensor with Type K TC (thermocouple) from Omega Engineering (Stamford, Conn., USA). The insulating material was a machinable glass ceramic composite, type 914, 6.35 mm thick, and has a thermal conductivity of about 0.40 W/mK from Cotronics Corporation (Brooklyn, N.Y., USA).

The Calculated Heat Flux reported in Table 3B was the heat flux that was calculated from the equation EqnB, for air nozzle assemblies having a slot formed of a plurality of holes or openings, based upon the velocity of the jet of air emitting from the slot and the temperature of the jet of heated air.

The Measured Heat Flux is the actual heat flux transmitted by the jet of heated air through the exterior surface of the photosensitive element. In some instances (Test 2) there was a relatively large difference between Measured Heat flux and Calculated Heat Flux which is believed to be due to operating conditions for Test at values for temperature and velocity that were outside of the recited range by which the equation for the Calculated Heat Flux was generated.

TABLE 3B

| | Measured Heat Flux (kW/m$^2$) | Calculated Heat Flux (EqnB) (kW/m$^2$) | Web Stuck? | Comments |
|---|---|---|---|---|
| Test 1A | 14.0 | 14.0 | Yes | Nozzle conditions for Test 1 |
| Test 1B | 14.0 | 14.0 | No | Nozzle conditions for Test 1 |
| Test 2 | 9 | 4.7 | Yes | Nozzle conditions for Test 2 |
| Test 3A | 9.4 | 8.3 | Yes | Nozzle conditions for Test 3 |
| Test 3B | 9.4 | 8.3 | Yes | Nozzle conditions for Test 3; except that load on the nip roll was about 100 pli |
| Test 4 | 16.9 | 17.9 | No | |
| Test 5 | 17.7 | 25.0 | No | |

Test 2 showed that heating the precursor with a jet of heated air having a heat flux that was less than 10 kW/m$^2$ was insufficient to heat the uncured material for removal by the development medium; and the heat flux was particularly insufficient for removal of the uncured material close to the floor (i.e., cured layer) of the precursor. The temperature of the heated air and the velocity of the air exiting the slot of the nozzle assembly were both outside the desired range based on the Calculated Heat Flux, and the Measured Heat Flux confirmed that the combination of conditions for the nozzle assembly created a jet of heated air with a heat flux less than 10 kW/m$^2$.

Tests 3A and 3B showed that heating the precursor with a jet of heated air having a heat flux that was less than 10 kW/m$^2$ was insufficient to heat the uncured material for removal by the development medium; and the heat flux was particularly insufficient for removal of the uncured material close to the floor (i.e., cured layer) of the precursor. Only the temperature of the heated air was outside the desired range based on the Calculated Heat Flux which is possibly the cause for the offset in heat flux from the Measured Heat Flux. Even when the load on the nip roll supporting the development medium was increased, the heat flux delivered by impingement of the jet of heated air was still insufficient to (pre)heat the uncured material on the precursor.

Test 1A and 1B showed that heating the precursor with a jet of heated air having a heat flux that was 14 kW/m$^2$ was borderline sufficient to heat the uncured material for removal by the development medium, since the development medium in Test 1A stuck and did not stick in Test 1B. The Measured Heat Flux confirmed the Calculated Heat Flux. For Tests 1A and 1B the temperature of the jet of heated air at the exit was too low, even though the velocity of the air exiting was acceptable, and the combination provided an acceptable heat flux impinging the precursor. It is contemplated that operation of a nozzle assembly at these conditions or substantially the same conditions, which creates the jet of heated air of 14 kW/m$^2$ but at the low end of air temperature, for thermal development of other types of photopolymerizable printing form precursors could repeatedly fail in some instances, and could repeatedly pass in other instances.

Tests 4 and 5 showed that heating the precursor with a jet of heated air having a heat flux that was more than 10 kW/m$^2$, i.e., at least about 17 kW/m$^2$ was sufficient to heat the uncured material for removal by the development medium; and the heat flux was particularly sufficient for removal of the uncured material close to the floor (i.e., cured layer) of the precursor and to avoid web sticking. The combination of air temperature and air velocity was within the useful boundaries to provide heat flux of the jet of heated air to the precursor suitable to soften, melt, flow or liquefy the uncured material and allow for effective removal by the development medium.

What is claimed is:

1. A method for preparing a relief printing form from a photosensitive element having an exterior surface and comprising a layer of a photopolymerizable composition capable of being partially liquefied, comprising the steps of:
   (a) heating the exterior surface to a temperature sufficient to cause a portion of the layer to liquefy and form liquefied material; and
   (b) contacting the photosensitive element with a development medium to allow the liquefied material to be removed by the development medium;
   wherein the heating step is performed using a jet of heated fluid emitting from a nozzle assembly at a velocity of 10 to 35 meter/second and temperature of 110° C. to 350° C., and impinging the exterior surface at a heat flux greater than or equal to 10 kiloWatts/m² (kW/m²) for a dwell time of less than 15 seconds.

2. The method of claim 1 wherein the fluid is a gas.

3. The method of claim 1 wherein the heat flux is 10 kW/m² up to and including 70 kW/m².

4. The method of claim 1 wherein the nozzle assembly comprises an aperture forming a slot that is adapted to emit the jet of heated gas having a heat flux determined from the following relationship $$\text{heat flux} = -32.5 \, (kW/m^2) + [0.687 \, (kW\text{-}sec/m^3) * \text{velocity} \, (m/sec)] + [0.203 \, (kW/m^{2\circ} C.) * \text{temperature} \, (^\circ C.)]$$

wherein the velocity is 15 to 30 meter/second and the temperature is 120° C. to 330° C.

5. The method of claim 1 wherein the nozzle assembly comprises an aperture forming a plurality of openings that is adapted to emit the jet of heated gas having a heat flux determined from the following relationship:

$$\text{heat flux} = -33.3 \, (kW/m^2) + [1.77 \, (kW\text{-}sec/m^3) * \text{velocity} \, (m/sec)] + [0.189 \, (kW/m^{2\circ} C.) * \text{temperature} \, (^\circ C.)]$$

wherein the velocity is 15 to 30 meter/second and the temperature is 120° C. to 330° C.

6. The method of claim 1 wherein the jet of heated gas emits at the velocity of 15 to 30 meters/second.

7. The method of claim 1 wherein the jet of heated gas emits at the velocity of 17 to 27 meter/second.

8. The method of claim 1 wherein the jet of heated gas emits at the temperature of 120° C. to 330° C.

9. The method of claim 1 wherein the gas jet emits at the temperature of 170° C. to 320° C.

10. The method of claim 1 wherein the heat flux is 20 to 65 kW/m².

11. The method of claim 1 wherein the dwell time is 2 to 14 seconds.

12. The method of claim 1 further comprising collecting a portion of the gas after impinging the exterior surface, and returning the collected gas to the nozzle assembly.

13. The method of claim 1 wherein a gap from an exit of the nozzle assembly to the exterior surface of the element is 1 to 15 millimeters.

14. The method of claim 13 wherein the gap is from 2 to 9 mm.

15. The method of claim 2 wherein the gas is air.

16. The method of claim 1 wherein the impinging step further comprises directing the gas jet at an angle between 45 and 135 degrees relative to a tangent at the exterior surface.

17. The method of claim 1 wherein the impinging step further comprises directing the gas jet at an angle between 80 and 100 degrees relative to a tangent at the exterior surface.

18. The method of claim 1 further comprising (c) heating the exterior surface with a roller to a temperature of 150° C. to 250° C., wherein the roller supports the development medium in contact with the surface.

19. The method of claim 18 further comprising repeating in order steps (a), (c), and (b) two or more times, to remove sufficient liquefied material to form a relief surface of the photopolymerizable layer.

20. The method of claim 1 further comprising repeating steps (a) and (b) two or more times, removing sufficient liquefied material to form a relief surface of the photopolymerizable layer.

21. An apparatus for preparing a relief printing form from a solid photosensitive element having an exterior surface and comprising a solid layer of a photopolymerizable composition, comprising:

means for heating the exterior surface to a temperature sufficient to soften uncured portions of the solid layer; and means for contacting the photosensitive element with a development medium to allow the softened uncured portions to be removed by the development medium;

wherein the means for heating comprises a jet of heated gas emitting from a nozzle assembly, wherein the nozzle assembly is configured to emit the jet of heated gas from the nozzle assembly at a velocity of 10 to 35 meter/second and temperature of 110° C. to 350° C., and have the gas jet impinge the exterior surface at a heat flux greater than 10 kWatts/m² for a dwell time of less than 15 seconds, and further wherein the nozzle assembly is configured to cause the jet of heated gas to soften the uncured portions of the solid layer but not remove the uncured portions.

22. The apparatus of claim 21 wherein the means for contacting comprises a roller assembly for supporting the development medium.

23. The apparatus of claim 22 wherein the roller assembly includes a roller that is heated to a temperature of 150° C. to 250° C.

24. The apparatus of claim 22 wherein the nozzle assembly preheats the element, the roller assembly is located adjacent the nozzle assembly at a distance from the exit of the nozzle of 1.27 cm to 7.62 cm.

25. The apparatus of claim 21 wherein the means for directing the gas jet comprises a chamber having an aperture forming a slot.

26. The apparatus of claim 21 wherein the means for directing the gas jet comprises a chamber having an aperture forming an array of holes.

27. The apparatus of claim 21, wherein the apparatus further comprises means for collecting a portion of the gas after impinging the exterior surface, and returning the collected gas to the nozzle assembly.

28. The apparatus of claim 21, wherein the apparatus further comprises means for directing the gas jet to impinge the exterior surface at an angle between 45 and 135 degrees relative to a tangent at the exterior surface.

29. The apparatus of claim 21, wherein a gap from an exit of the nozzle assembly to the exterior surface of the element is 1 to 15 millimeters.

30. The apparatus of claim 24, wherein the nozzle assembly is positioned so that it preheats the element just prior to contact by the development medium that is supported by the roller assembly.

31. The apparatus of claim 27 wherein the means for collecting and returning the collected gas is part of the nozzle assembly.

32. The apparatus of claim 21 wherein the nozzle assembly comprises a nozzle having an exit aperture through which the heated gas exits and a recycle opening that is attached to the nozzle and adjacent to the exit aperture for capturing a portion of the heated gas after impingement on the exterior surface.

33. The apparatus of claim 21 wherein the development medium comprises an absorbent material.

34. An apparatus for preparing a relief printing form from a solid photosensitive element having an exterior surface and comprising a solid layer of a photopolymerizable composition, comprising:

means for heating the exterior surface to a temperature sufficient to soften uncured portions of the solid layer; and means for contacting the photosensitive element with a development medium to allow the softened uncured portions to be removed by the development medium;

wherein the means for heating comprises a nozzle assembly configured to emit a jet of heated gas at a velocity of 10 to 35 meter/second and temperature of 110° C. to 350° C., and have the gas jet impinge the exterior surface at a heat flux greater than 10 kWatts/m$^2$ for a dwell time of less than 15 seconds, and further wherein the nozzle assembly is configured to cause the jet of heated gas to soften the uncured portions of the solid layer but not remove the uncured portions.

* * * * *